(12) United States Patent
Nakamura (10) Patent No.: US 9,596,763 B2
(45) Date of Patent: Mar. 14, 2017

(54) CAPACITOR HOLDER, AND CAPACITOR HOLDING STRUCTURE

(71) Applicant: KITAGAWA INDUSTRIES CO., LTD., Inazawa-shi (JP)

(72) Inventor: Tatsuya Nakamura, Inazawa (JP)

(73) Assignee: KITAGAWA INDUSTRIES CO., LTD., Inazawa-Shi (JP)

( * ) Notice: Subject to any disclaimer, the term of this patent is extended or adjusted under 35 U.S.C. 154(b) by 94 days.

(21) Appl. No.: 14/442,105

(22) PCT Filed: Oct. 29, 2013

(86) PCT No.: PCT/JP2013/079289
§ 371 (c)(1),
(2) Date: May 12, 2015

(87) PCT Pub. No.: WO2014/073421
PCT Pub. Date: May 15, 2014

(65) Prior Publication Data
US 2016/0295697 A1    Oct. 6, 2016

(30) Foreign Application Priority Data

Nov. 12, 2012  (JP) .................................. 2012-248608

(51) Int. Cl.
*H01G 2/10* (2006.01)
*H05K 1/18* (2006.01)
(Continued)

(52) U.S. Cl.
CPC .............. *H05K 1/181* (2013.01); *H01G 2/06* (2013.01); *H05K 3/301* (2013.01); *H05K 3/3447* (2013.01);
(Continued)

(58) Field of Classification Search
CPC .......... H05K 2201/10606; H05K 2201/10015; H05K 2201/10583; H05K 2201/09063;
(Continued)

(56) References Cited

U.S. PATENT DOCUMENTS 4,591,951 A * 5/1986 Iwamoto ................ H01G 9/012
                                                   174/138 G
5,037,309 A    8/1991 Abe et al.
(Continued)

FOREIGN PATENT DOCUMENTS

DE   102010048715   4/2012
JP          3-8465   1/1991
(Continued)

OTHER PUBLICATIONS

English translation of International Preliminary Report on Patentability from corresponding PCT Appln. No. PCT/JP2013/079289 dated May 21, 2015.
(Continued)

*Primary Examiner* — Sherman Ng
(74) *Attorney, Agent, or Firm* — Grossman, Tucker, Perreault & Pfleger, PLLC (57) ABSTRACT

A capacitor holder comprises: a holding portion having a cylindrical inner wall surface, at least an outer peripheral portion of the inner wall surface being open, the holding portion being configured to hold a capacitor inserted through the opening into an inside of the inner wall surface; a fixed portion formed integrally with the holding portion and positioned opposite to the opening of the holding portion; a pair of fitting grooves formed at a pair of end surfaces of the fixed portion opposed to each other adjacent to the holding portion, the fitting grooves being configured to fittably engage with end edges of a printed circuit board to extend along a surface of the printed circuit board; and a proximity
(Continued)

suppressor configured to suppress portions of the fixed portion where the fitting grooves are formed from being brought into proximity each other.

12 Claims, 7 Drawing Sheets

(51) Int. Cl.
*H01G 2/06* (2006.01)
*H05K 3/30* (2006.01)
*H05K 3/34* (2006.01)

(52) U.S. Cl.
CPC .............. *H05K 2201/09063* (2013.01); *H05K 2201/10015* (2013.01); *H05K 2201/10583* (2013.01); *H05K 2201/10606* (2013.01)

(58) Field of Classification Search
CPC ...... H05K 3/3447; H05K 3/301; H05K 1/181; H01G 2/06
USPC ........................................................ 361/517
See application file for complete search history.

(56) References Cited

U.S. PATENT DOCUMENTS

| | | | | |
|---|---|---|---|---|
| 5,707,249 A * | 1/1998 | Byrd | ................. | H01R 12/7076 361/767 |
| 5,880,926 A * | 3/1999 | Nishino | ................. | H01G 2/065 361/517 |
| 6,039,612 A | 3/2000 | Brown et al. | | |
| 6,735,074 B2 * | 5/2004 | Nakamura | ............. | H01G 9/008 361/520 |
| 6,855,885 B1 * | 2/2005 | Schweikert | .............. | H01G 2/04 174/50 |
| 7,089,657 B1 * | 8/2006 | Masumoto | ............. | H05K 3/301 29/741 |
| 7,532,484 B1 * | 5/2009 | Sailor | ...................... | H01G 2/06 361/773 |
| 2010/0267252 A1 * | 10/2010 | Fujimoto | ................. | H01G 2/06 439/55 |
| 2011/0038133 A1 | 2/2011 | McNamara et al. | | |

FOREIGN PATENT DOCUMENTS

| | | |
|---|---|---|
| JP | 7-218553 | 8/1995 |
| JP | 8-116155 | 5/1996 |
| JP | 2005-259406 | 9/2005 |
| JP | 1360657 | 6/2009 |
| JP | 2010-541240 | 12/2010 |
| JP | 2011-151184 | 8/2011 |
| JP | 2012-049253 | 3/2012 |

OTHER PUBLICATIONS

Search Report from related EPO Appln. No. 13852709.8 dated Jun. 14, 2016.
International Search Report from corresponding PCT Appln. No. PCT/JP2013/079289 dated Jan. 28, 2014.
English translation of International Preliminary Report on Patentability from corresponding PCT Appln. No. PCT/JP2013/079289 dated Jan. 28, 2014.
Office Action from related Japanese Appln. No. 2012-248608, dated Sep. 20, 2016. English translation attached.

* cited by examiner

FIG. 7D

CAPACITOR HOLDER, AND CAPACITOR HOLDING STRUCTURE

CROSS-REFERENCE TO RELATED APPLICATIONS

This international application claims the priority of the Japanese Patent Application No. 2012-248608 filed in Japan Patent Office on Nov. 12, 2012. The entire disclosure of the Japanese Patent Application No. 2012-248608 is incorporated herein by reference.

TECHNICAL FIELD

This invention relates to a capacitor holder configured to hold a capacitor on a printed circuit board, and to a capacitor holding structure having a combination of the capacitor holder and a printed circuit board. More specifically, this invention relates to a capacitor holder and a capacitor holding structure configured to hold a cylindrical capacitor lying on its side.

BACKGROUND ART

In recent years, electronic components mounted on a printed circuit board have been required to further reduce their heights (i.e., exhibit less heights on the printed circuit board) in accordance with the downsizing and thinning of electronic equipment.

A capacitor, when mounted upright on the printed circuit board, becomes relatively high on the printed circuit board. In some cases, therefore, the capacitor is laid on the printed circuit board (i.e. the capacitor is disposed such that the axial direction thereof becomes substantially parallel to the surface of the printed circuit board) thereby to decrease the protruding amount of the capacitor from the printed circuit board.

As a capacitor holder configured to hold the capacitor laid on the printed circuit board, for example, there is proposed a capacitor holder including a holding portion made of a resin having a cylindrical inner wall surface and an opening formed in at least an outer peripheral portion of the inner wall surface and, holding the capacitor inserted into the inside of the inner wall surface through the opening while the resin thereof is elastically deformed. There is also proposed the holding portion provided with a plurality of hooked legs engageable with holes formed in the printed circuit board at the position opposite to the opening. By engaging the legs with the holes, the capacitor holder is mounted on the printed circuit board (see, for example, Patent Literature 1).

PRIOR ART DOCUMENTS

Patent Documents

PATENT DOCUMENT 1: Japanese Design Registration No. 1360657

SUMMARY OF THE INVENTION

Problems to be Solved by the Invention

However, using only the hooked engaging portion for holding a capacitor as described in Patent Document 1 does not always provide a sufficient holding force. This applies in particular to the case in which the capacitor is inserted into the capacitor holder preliminarily mounted on the printed circuit board. In this case, if the holding portion is forcefully opened when the capacitor is inserted, the legs may approach each other in reaction thereto, and easily disengaged from the holes.

According to one aspect of the invention, in a capacitor holder and a capacitor holding structure configured to hold a cylindrical capacitor laid on a printed circuit board, it is preferred to enhance the force of holding the capacitor by inhibiting the capacitor holder from disengaging from the printed circuit board.

Means for Solving the Problems

A capacitor holder according to the invention comprises: a holding portion made of a resin to have a cylindrical inner wall surface, at least an outer peripheral portion of the inner wall surface being open, the holding portion being configured to hold a capacitor inserted through the opening into an inside of the inner wall surface while elastically deforming the resin; a fixed portion formed of the resin integrally with the holding portion and positioned opposite to the opening of the holding portion; a pair of fitting grooves formed at a pair of end surfaces of the fixed portion opposed to each other adjacent to the holding portion, the pair of fitting grooves being configured to fittably engage with end edges of a printed circuit board to extend along a surface of the printed circuit board; and a proximity suppressor formed of the resin as a part of the fixed portion and configured to suppress portions of the fixed portion where the fitting grooves are formed from being brought into proximity each other.

The capacitor holder according to the invention configured as described above is in use together with the printed circuit board comprising a hole. The hole has inner wall surfaces extending in parallel to each other and opposed to each other with interposition of a clearance through which the pair of fitting grooves provided to the fixed portion simultaneously fittably engage therewith. In the capacitor holder according to the invention in use, the fitting grooves are engaged with the inner wall surfaces of the hole. The portions of the fixed portion where the fitting grooves are formed are suppressed by the proximity suppressor from approaching each other. Thus, it is difficult to engage the fitting grooves with the inner wall surfaces of the hole by bringing the fitting grooves into proximity with each other. In view of the above, when the capacitor holder according to the invention is mounted on the printed circuit board, the hole is directly extended to the end edges of the printed circuit board, or alternatively, the hole having the inner wall surfaces is preliminarily provided continuously with a wide width portion sized to allow the pair of end surfaces to simultaneously penetrate therethrough. With this arrangement, the fixed portion is moved along the inner wall surfaces of the hole from either the end edges of the printed circuit board or the inside of the wide width portion. Accordingly, the opposing inner wall surfaces of the hole are fittably engaged to the fitting grooves.

The holding portion of the capacitor holder, which continuously connected from the fixed portion, has the cylindrical inner wall surface, and at least an outer peripheral portion of the inner wall surface is open. When the capacitor is inserted through the opening into the inside of the inner wall surface while elastically deforming the resin, the holding portion holds the capacitor. The fixed portion is integrally formed at the position opposite to the opening of the holding portion. Thus, the capacitor holder according to the invention can hold a cylindrical capacitor on the printed circuit board in an overturned posture. In addition, as described above, the portions of the fixed portion where the fitting grooves are formed are suppressed by the proximity suppressor from approaching each other. This arrangement suppresses the fixed portion from being easily disengaged from the printed circuit board. Accordingly, the holding force with which the capacitor is held is enhanced.

In the capacitor holder according to the invention, the fitting grooves may be formed at positions not to cross a cylindrical surface in contact with the inner wall surface. The cylindrical surface means a hypothetical surface of a cylindrical object inserted into the holding portion. In the above configuration, a clearance is formed between the capacitor held by the inner wall surfaces of the holding portion and the printed circuit board that is fittably engaged to the fitting grooves. With this arrangement, the capacitor is not in contact with the printed circuit board. Accordingly, the generation of a so-called chattering, which is the repeated contacting of the capacitor with the printed circuit board due to vibrations or the like, is favorably suppressed.

In the capacitor holder according to the invention, an end surface of the fixed portion including the proximity suppressor may be in contact with a cylindrical surface in contact with the inner wall surface, the end surface being opposite to the opening. The cylindrical surface means a hypothetical surface of a cylindrical object inserted into the holding portion. In the above configuration, the protruding amount of the capacitor holder by which the capacitor holder protrudes from the back surface of the printed circuit board is equal to the protruding amount of the capacitor by which the capacitor protrudes from the back surface. Hence, the printed circuit board including the capacitor and the capacitor holder exhibits further less height.

A capacitor holding structure according to the invention comprises: the capacitor holder according to any one of the above; and a printed circuit board comprising a hole having: narrow width portions having inner wall surfaces opposed to each other and extending in parallel to each other, the inner wall surfaces being interposed with a clearance that allows the pair of fitting grooves to simultaneously engage therewith; and a wide width portion continuously connected from the narrow width portions and sized to allow the pair of end surfaces to simultaneously penetrate therethrough.

In the capacitor holding structure according to the invention configured as described above, the fixed portion of the capacitor holder is inserted into the wide width portion of the hole formed in the printed circuit board, and moved toward the narrow width portions. With this arrangement, the paired fitting grooves of the fixed portion are in use engaged with the inner wall surfaces of the narrow width portions. Specifically, in the capacitor holding structure according to the invention, by providing the printed circuit board with the hole having the narrow width portions and the wide width portion described above, the capacitor holder according to the invention can be easily mounted. The capacitor holder thus exhibits a high holding force as described above.

In the above configuration, the narrow width portions may be formed into a plurality of lines in which the inner wall surfaces extend in parallel to each other. Further, the wide width portion may bring the narrow width portions into communication with each other in the direction in which the inner wall surfaces are opposed to each other. With this arrangement, by mounting capacitor holders according to the invention on the narrow width portions, a plurality of capacitors can be held in parallel to each other.

In the description that follows, the exemplary embodiments according to the invention will be described.

EXPLANATION OF REFERENCE NUMERALS

1 . . . Capacitor holder
3 . . . Fixed portion
3A . . . Recess
3B . . . Opening
3C . . . Wall
3D . . . Cutout
3E . . . Fitting groove
5 . . . Holding portion
5A . . . Opening
20 . . . Printed circuit board
21 . . . Hole
21A . . . Narrow width portion
21B . . . Wide width portion
40 . . . Capacitor

MODE FOR CARRYING OUT THE INVENTION

[Configuration of Capacitor Holder]

Figure 1A:
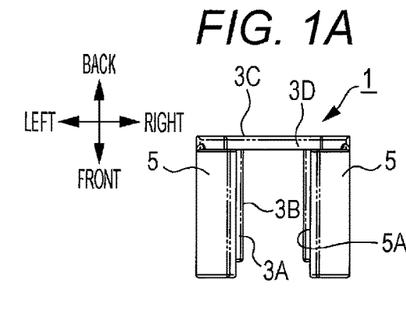
FIGS. 1A to 1G are diagrams each illustrating a configuration of a capacitor holder to which the invention is applied.
Figure 1B:
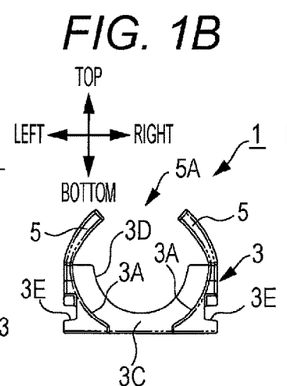
Figure 1C:
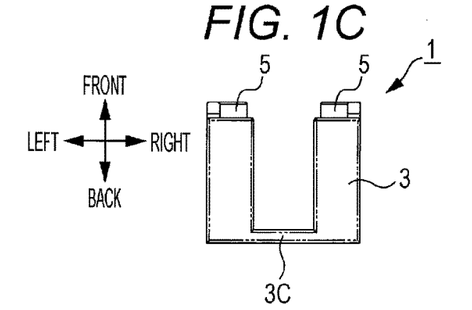
Figure 1D:
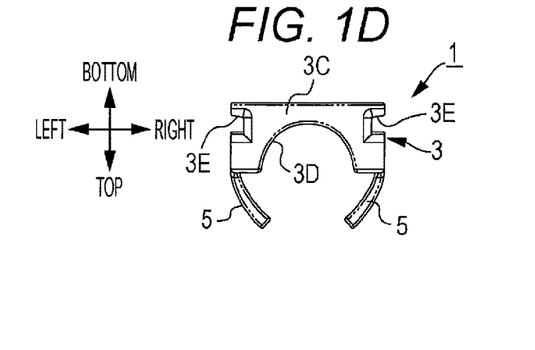
Figure 1E:
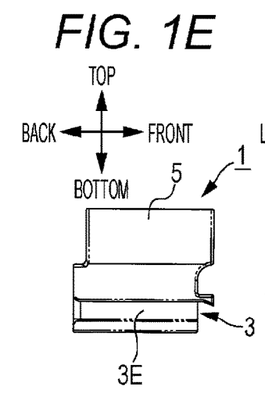
Figure 1F:
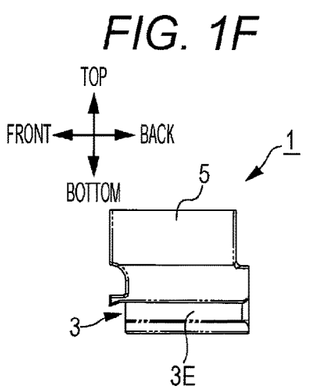
Figure 1G:
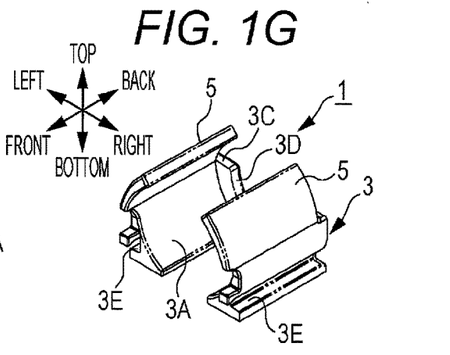

FIGS. 1A to 1G illustrate the configuration of an exemplary capacitor holder 1 according to an embodiment of this invention. FIG. 1A is a plan view thereof, FIG. 1B is a front view thereof, FIG. 1C is a bottom view thereof, FIG. 1D is a rear view thereof, FIG. 1E is a left lateral view thereof, FIG. 1F is a right lateral view thereof, and FIG. 1G is a perspective view thereof.

In the following description, the relative positional relationship between the respective portions of the capacitor holder 1 will be described with reference to the directions, such as front and back, right and left, and top and bottom directions, as indicated in the arrows in FIGS. 1A to 1G. That is, the lower side shall mean the side at which the capacitor holder 1 is mounted on the printed circuit board 20 (see FIG. 2). The front side shall mean the side at which the center of a capacitor 40 (see FIG. 4B) is opposed to the capacitor holder 1. However, these directions are merely definitions for describing the relative positional relationship between the respective portions of the capacitor holder 1. In other words, these directions have nothing to do with the mounting directions where the capacitor holder 1 is actually in use.

As illustrated in FIGS. 1A to 1G, the capacitor holder 1 comprises holding portions 5 at upper positions on a fixed portion 3. A fixed portion 3 is fixed on the printed circuit board 20. The holding portions 5 hold the capacitor 40. The fixed portion 3 and the holding portions 5 are integrally formed of an electrically insulating resin (such as polyamide, polypropylene, and polyethylene). The holding portions 5 are a pair of thin pieces protruding along the cylindrical surface respectively from upper right and left ends of the fixed portion 3. An opening 5A is formed between upper ends of the holding portions 5. In addition, recesses 3A are formed in the fixed portion 3. The recesses 3A have cylindrical inner wall surfaces continuously connected from the cylindrical inner wall surface of the holding portions 5, respectively. An opening 3B is formed between lower ends of the recesses 3A.

A wall 3C (an example of a proximity suppressor) stands upright from the back end of the recesses 3A. The wall 3C is continuously connected from the recesses 3A on both sides of the opening 3B. The wall 3C extends only to a position lower than the holding portions 5. A semicircular cutout 3D is formed in the wall 3C at a position opposed to an explosion proof valve (not illustrated) of the capacitor 40. The explosion proof valve is provided to a distal end 41 of the capacitor 40. Right and left end surfaces of the fixed portion 3 are provided with fitting grooves 3E, respectively. The grooves 3E penetrate through the fixed portion 3 in the front and back direction. The cross-sectional shape of each fitting groove 3E is rectangular with one side opened. The fitting grooves 3E can be fitted to the end edges of the printed circuit board 20 along the surface of the printed circuit board 20.

[Example of Capacitor Holding Structure Using the Above Capacitor Holder]

Figure 2:
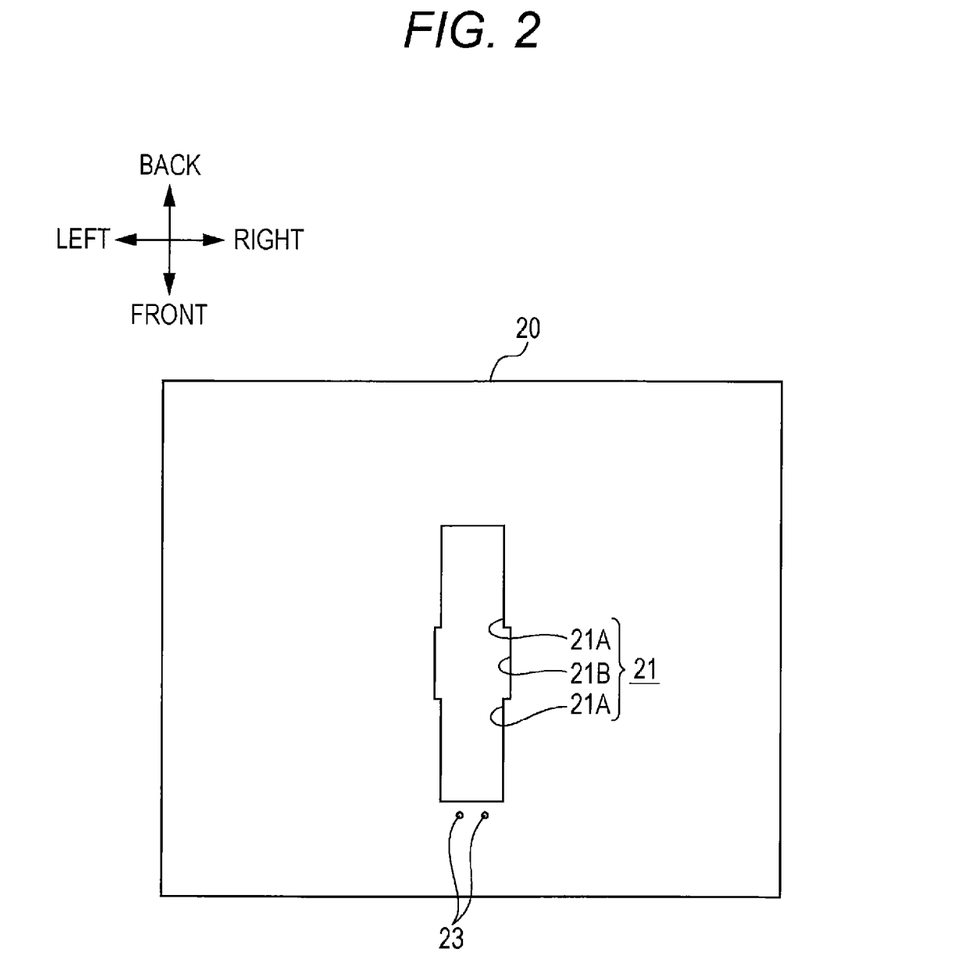
FIG. 2 is a plan view of an exemplary printed circuit board on which the capacitor holder is to be mounted.

The capacitor holder 1 configured as described above is in use mounted on, for example, the printed circuit board 20 provided with a hole 21 as illustrated in FIG. 2. As illustrated in FIG. 2, the hole 21 comprises a pair of narrow width portions 21A and a wide width portion 21B. The narrow width portions 21A each have a pair of inner wall surfaces at right and left sides. The inner wall surfaces are opposed to each other while extending in parallel to each other, with interposition of a clearance that allows the paired fitting grooves 3E to simultaneously engage therewith. The wide width portion 21B is sized to tolerate the penetration of the fixed portion 3 in the upper and lower direction. In this example, the paired narrow width portions 21A are positioned at both sides of the wide width portion 21B in the front and back direction while the centers of the narrow width portions 21A in the right and left direction are coincident with the center of the wide width portion 21B in the right and left direction. In other words, the hole 21 as a whole is shaped like a cross.

The length of the hole 21 is the sum of the lengths of the narrow width portion 21A, wide width portion 21B and narrow width portion 21A that are continuously connected in the front and back direction. The length of the hole 21 is set to be slightly greater than the axial length of the capacitor 40. In addition, a pair of lead holes 23 through which leads 43 provided at a base end 42 of the capacitor 40 penetrate are formed at positions outside the end of one of the narrow width portions 21A, such as a further front side of a front narrow width portion 21A.

Figure 3A:
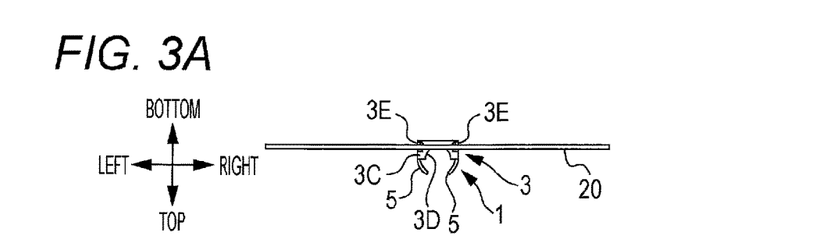
FIGS. 3A to 3E are diagrams each illustrating a state in which the capacitor holder is mounted on the printed circuit board.
Figure 3B:
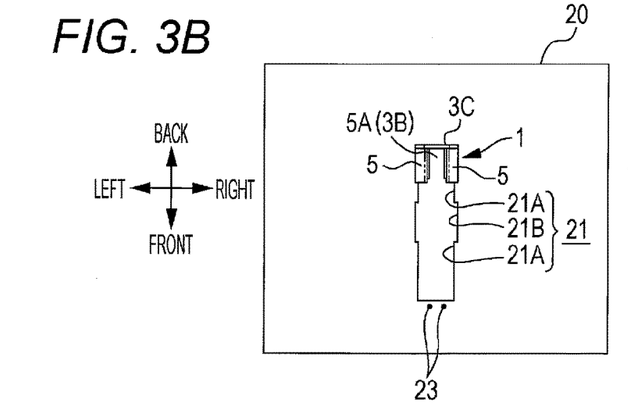
Figure 3C:
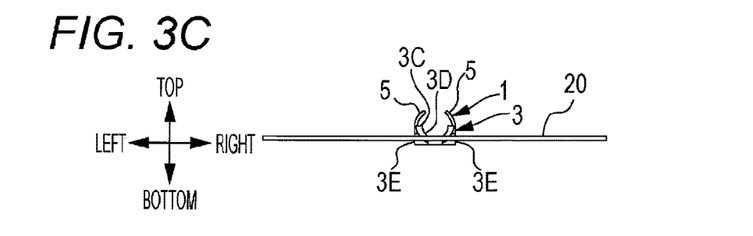
Figure 3D:
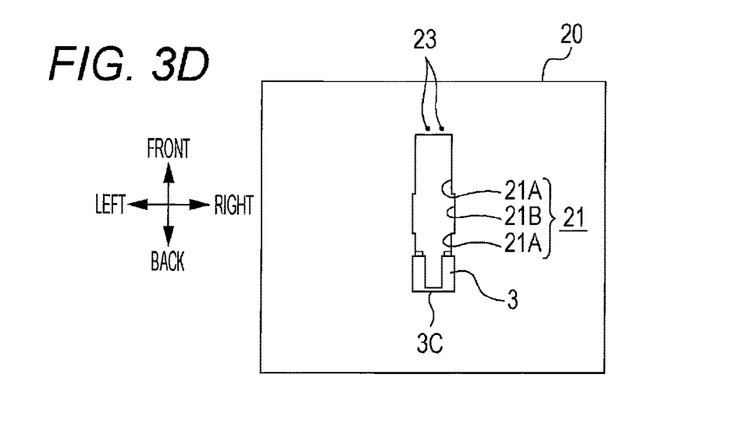
Figure 3E:
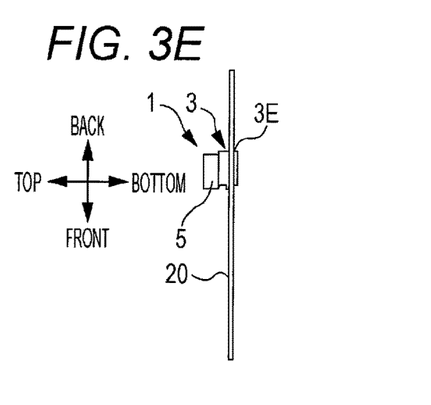

The fixed portion 3 of the capacitor holder 1 is inserted through the wide width portion 21B. The paired fitting grooves 3E are fitted into the narrow width portion 21A located backward than the capacitor holder 1. Then, the capacitor holder 1 is slid to the back end of the narrow width portion 21A and used. FIGS. 3A to 3E illustrate the capacitor holding structure in which the capacitor holder 1 is mounted on the printed circuit board 20. FIG. 3A is a back view thereof, FIG. 3B is a plan view thereof, FIG. 3C is a front view thereof, FIG. 3D is a bottom view thereof, and FIG. 3E is a right lateral view thereof.

Figure 4A:
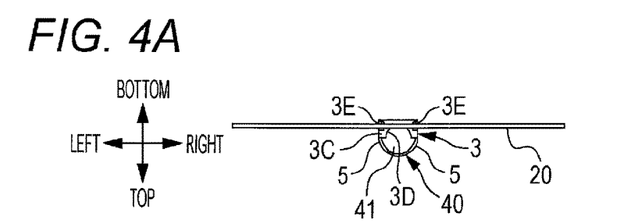
FIG. 4A to 4E are diagrams each illustrating a state in which the above state further includes a mounted capacitor.
Figure 4B:
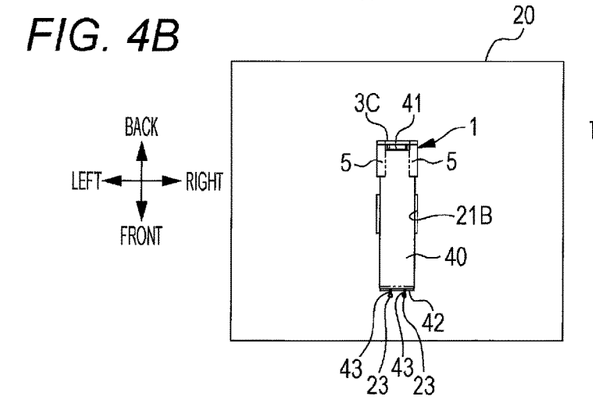
Figure 4C:
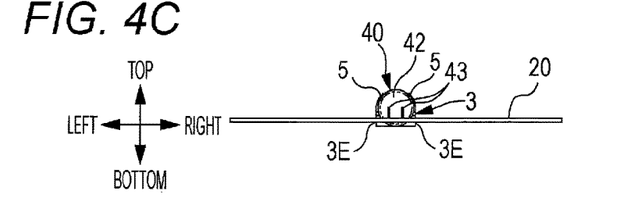
Figure 4D:
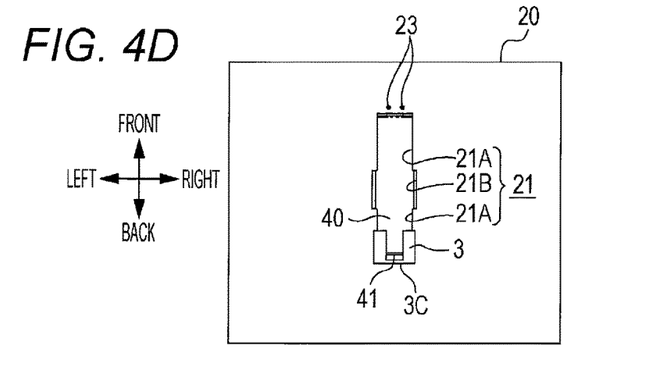
Figure 4E:
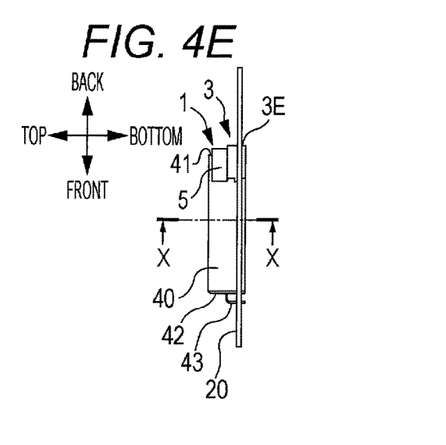

The capacitor 40 is inserted into the capacitor holding structure configured as above. Specifically, the capacitor 40 is inserted into the inner wall surfaces of the holding portions 5 and the recesses 3A through the opening 5A of the capacitor holder 1 while elastically deforming the holding portions 5. Then, the holding portions 5 return to their respective original positions after the insertion of the capacitor 40, and hold the capacitor 40. FIG. 4A to 4E illustrate a state in which the capacitor 40 is mounted on the capacitor holding structure. FIG. 4A is a back view thereof, FIG. 4B is a plan view thereof, FIG. 4C is a front view thereof, FIG. 4D is a bottom view thereof, and FIG. 4E is a right lateral view thereof.

As illustrated in FIGS. 4A to 4E, after the capacitor 40 is laid and held by the capacitor holder 1 as described above, the leads 43 are inserted into the lead holes 23. Subsequently, the capacitor holder 1 and the capacitor 40 are masked from below and then passed through a flow solder tank. Soldering is therefore performed on the printed circuit board 20 on which the capacitor 40 is thus fixed.

Figure 5:
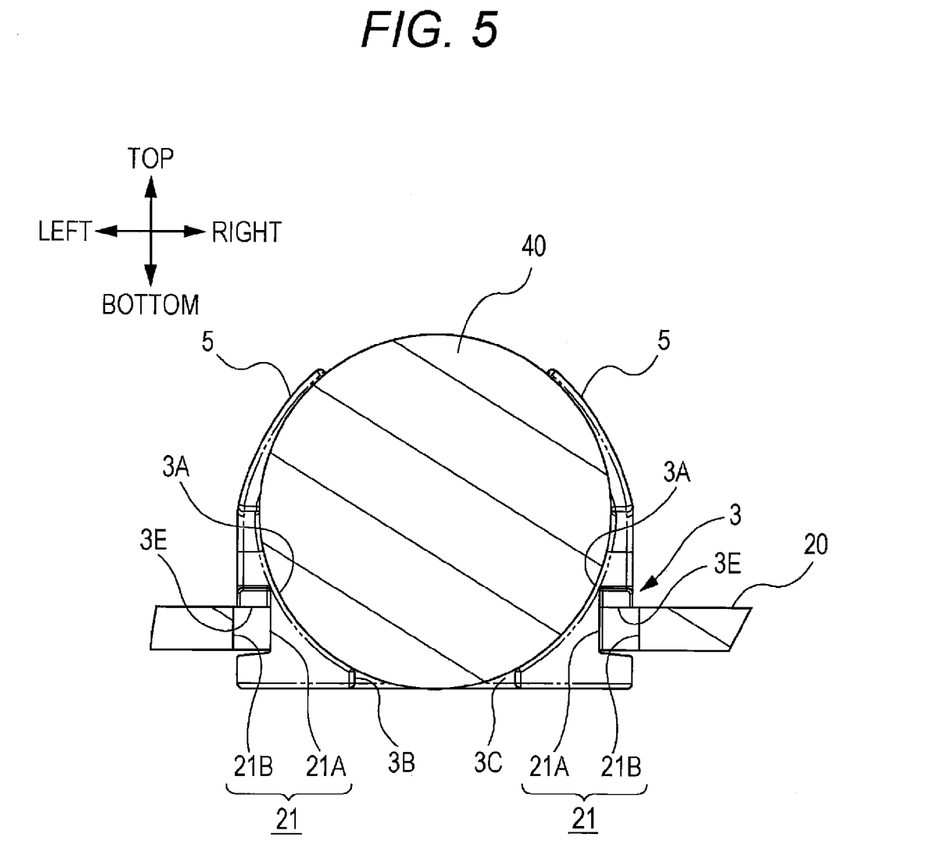
FIG. 5 is an enlarged cross sectional view of a cross section taken along X-X in FIG. 4E.

Further, as illustrated in FIG. 5 (the cross sectional view taken along the X-X line in FIG. 4E), the cylindrical surface of the capacitor 40 contacts the inner wall surfaces of the holding portions 5 and the recesses 3A described above. The fitting grooves 3E are provided at positions not to cross the cylindrical surface of the capacitor 40. Thus, a clearance is formed between the capacitor 40 held by the inner wall surfaces and the printed circuit board 20. The capacitor 40 is therefore not in contact with the printed circuit board 20. Hence, the generation of a so-called chattering, which is the repeated contacting of the capacitor 40 with the printed circuit board 20 due to vibrations or the like, is favorably suppressed. As described above, in this embodiment, the capacitor 40 can be held without contacting the printed circuit board 20 even at a single position. Thus, in this embodiment, the capacitor 40 and the printed circuit board 20 are also thermally insulated from each other.

As illustrated in FIG. 5, the lower end surface of the fixed portion 3 including the wall 3C is in contact with the cylindrical surface of the capacitor 40, which is in contact with the inner wall surfaces of the holding portions 5 and the recesses 3A. Thus, the protruding amount of the capacitor holder 1 by which the capacitor holder 1 protrudes from the back surface (lower surface) of the printed circuit board 20 is equal to the protruding amount of the capacitor 40 by which the capacitor 40 protrudes from the back surface. Thus, the printed circuit board 20 including the capacitor 40 and the capacitor holder 1 can be successfully provided as one with less height. Further, the protruding amount of the fixed portion 3 by which the fixed portion 3 protrudes to the back of the printed circuit board 20 is small as compared to an arrangement where a known hook is used for the fixation. Hence, the printed circuit board 20 including the capacitor 40 and the capacitor holder 1 can be more successfully provided as one with less height.

[Other Example of Capacitor Holding Structure Using the Above Capacitor Holder]

Figure 6:
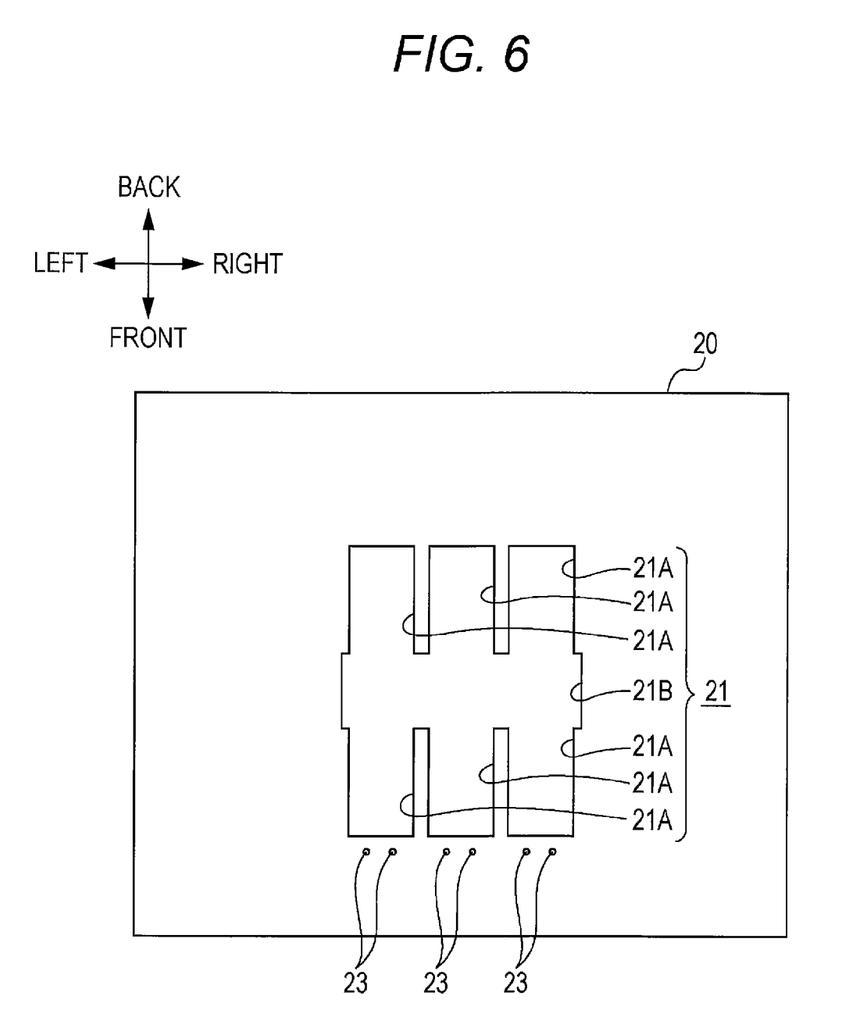
FIG. 6 is a plan view of another exemplary printed circuit board on which the capacitor holder is to be mounted.
Figure 7A:
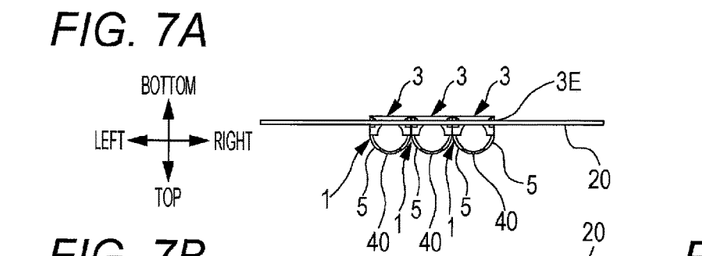
FIGS. 7A to 7E are diagrams each illustrating a state in which the capacitor holder and capacitors are mounted on the printed circuit board.
Figure 7B:
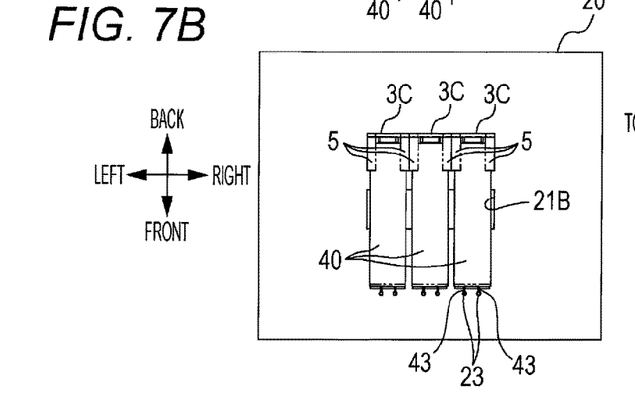
Figure 7C:
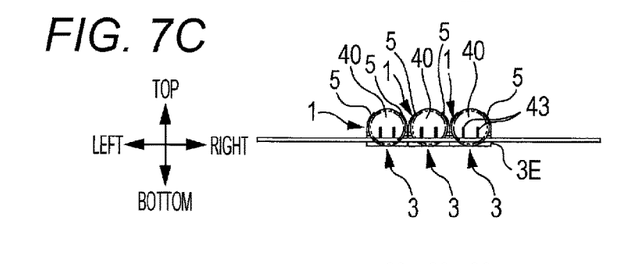
Figure 7D:
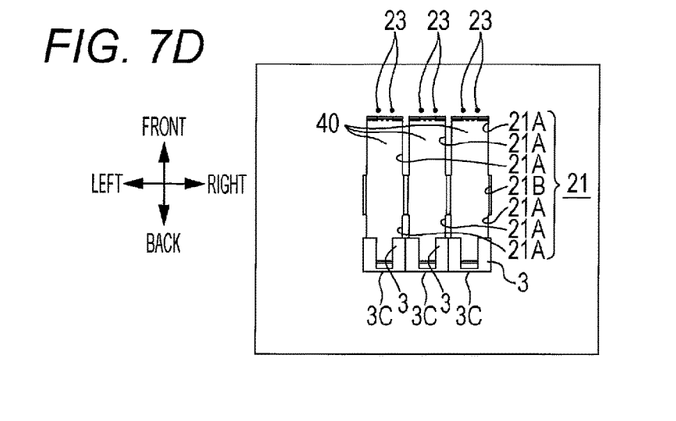
Figure 7E:
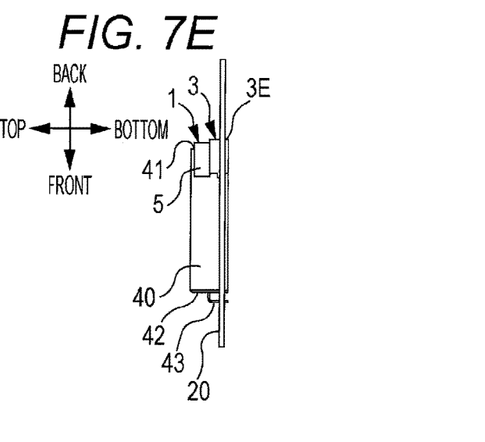

Next, FIG. 6 is a plan view of another example of the printed circuit board 20 on which the capacitor holder 1 is to be mounted. The hole 21 of the printed circuit board 20 of this example comprises three parallel lines of the narrow width portions 21A at each of the front and back positions. The wide width portions 21B corresponding to the respective narrow width portions 21A are in communication with each other, thereby forming a single wide width portion 21B. In this case, the hole 21 is an integrated hole. Alternatively, for example, the capacitor holders 1 can be attached to three backward narrow width portions 21A as the example described above to form capacitor holding structures. Therefore, three capacitors 40 can be placed and held in parallel. FIGS. 7A to 7E respectively illustrate a state in which the capacitors 40 are mounted on the capacitor holding structure of this example. FIG. 7A is a back view thereof, FIG. 7B is a plan view thereof, FIG. 7C is a front view thereof, FIG. 7D is a bottom view thereof, and FIG. 7E is a right lateral view thereof.

In each of the capacitor holding structures described above, the capacitor 40 may be first mounted on the capacitor holder 1, and then the capacitor holder 1 may be mounted on the printed circuit board 20. In addition, the capacitor holder 1 may hold a base end 42. In such configuration, the leads 43 are inserted into the lead holes 23 through the cutout 3D. Further, both ends of the capacitor 40 may be held by the capacitor holder 1. Such configuration can more successfully suppress the chattering from being caused by the contacting of the capacitor 40 with the printed circuit board 20.

The invention is not limited at all to the embodiments as described above. The invention may be variously carried out within the scope not departing from the gist of the invention. The lower surface of the fixed portion 3 may be continuously connected as a whole, and shaped like a rectangular plate, for example. Further, the invention is not limited to the technical field where the capacitor 40 is held in parallel to the printed circuit board 20. The invention is likewise applicable to a technical field, for example, where the capacitor 40 is held substantially in parallel to the printed circuit board 20 at an angle of, for example, 10 degrees or less. Each portion may be designed so that the lateral surfaces (lower surface) of the capacitor 40 extend from the lower surface of the fixed portion 3. In addition, a back portion of the fixed portion 3 may be provided with a fitting groove configured to fittably engage with the narrow width portion 21A.

The invention claimed is:

1. A capacitor holder, comprising:
    a holding portion made of a resin to have a cylindrical inner wall surface, at least an outer peripheral portion of the inner wall surface being open, the holding portion being configured to hold a capacitor inserted through the opening into an inside of the inner wall surface while elastically deforming the resin;
    a fixed portion formed of the resin integrally with the holding portion and positioned opposite to the opening of the holding portion;
    a pair of fitting grooves formed at a pair of end surfaces of the fixed portion opposed to each other adjacent to the holding portion, the pair of fitting grooves being configured to fittably engage with end edges of a printed circuit board to extend along a surface of the printed circuit board; and
    a proximity suppressor formed of the resin as a part of the fixed portion and configured to suppress portions of the fixed portion where the fitting grooves are formed from being brought into proximity each other.

2. The capacitor holder according to claim 1, wherein the fitting grooves are formed at positions not to cross a cylindrical surface in contact with the inner wall surface.

3. The capacitor holder according to claim 1, wherein an end surface of the fixed portion including the proximity suppressor is in contact with a cylindrical surface in contact with the inner wall surface, the end surface being opposite to the opening.

4. A capacitor holding structure, comprising:
    the capacitor holder according to claim 1; and
    a printed circuit board comprising a hole having: narrow width portions having inner wall surfaces opposed to each other and extending in parallel to each other, the inner wall surfaces being interposed with a clearance that allows the pair of fitting grooves to simultaneously engage therewith; and a wide width portion continuously connected from the narrow width portions and sized to allow the pair of end surfaces to simultaneously penetrate therethrough.

5. The capacitor holding structure according to claim 4, wherein the narrow width portions are formed into a plurality of lines in which the inner wall surfaces extend in parallel to each other, and the wide width portion brings the narrow width portions in communication with each other in a direction in which the inner wall surfaces are opposed to each other.

6. The capacitor holder according to claim 2, wherein an end surface of the fixed portion including the proximity suppressor is in contact with a cylindrical surface in contact with the inner wall surface, the end surface being opposite to the opening.

7. A capacitor holding structure, comprising:
    the capacitor holder according to claim 2; and
    a printed circuit board comprising a hole having: narrow width portions having inner wall surfaces opposed to each other and extending in parallel to each other, the inner wall surfaces being interposed with a clearance that allows the pair of fitting grooves to simultaneously engage therewith; and a wide width portion continuously connected from the narrow width portions and sized to allow the pair of end surfaces to simultaneously penetrate therethrough.

8. The capacitor holding structure according to claim 7, wherein the narrow width portions are formed into a plurality of lines in which the inner wall surfaces extend in parallel to each other, and the wide width portion brings the narrow width portions in communication with each other in a direction in which the inner wall surfaces are opposed to each other.

9. A capacitor holding structure, comprising:
    the capacitor holder according to claim 3; and
    a printed circuit board comprising a hole having: narrow width portions having inner wall surfaces opposed to each other and extending in parallel to each other, the inner wall surfaces being interposed with a clearance that allows the pair of fitting grooves to simultaneously engage therewith; and a wide width portion continuously connected from the narrow width portions and sized to allow the pair of end surfaces to simultaneously penetrate therethrough.

10. The capacitor holding structure according to claim 9, wherein the narrow width portions are formed into a plurality of lines in which the inner wall surfaces extend in parallel to each other, and the wide width portion brings the narrow width portions in communication with each other in a direction in which the inner wall surfaces are opposed to each other.

11. A capacitor holding structure, comprising:
    the capacitor holder according to claim 6; and
    a printed circuit board comprising a hole having: narrow width portions having inner wall surfaces opposed to each other and extending in parallel to each other, the inner wall surfaces being interposed with a clearance that allows the pair of fitting grooves to simultaneously engage therewith; and a wide width portion continuously connected from the narrow width portions and sized to allow the pair of end surfaces to simultaneously penetrate therethrough.

12. The capacitor holding structure according to claim 11, wherein the narrow width portions are formed into a plurality of lines in which the inner wall surfaces extend in parallel to each other, and the wide width portion brings the narrow width portions in communication with each other in a direction in which the inner wall surfaces are opposed to each other.

\* \* \* \* \*